(12) United States Patent
Yu et al.

(10) Patent No.: US 11,832,495 B2
(45) Date of Patent: Nov. 28, 2023

(54) DISPLAY APPARATUS AND MANUFACTURING METHOD THEREFOR

(71) Applicant: BOE Technology Group Co., Ltd., Beijing (CN)

(72) Inventors: Yong Yu, Beijing (CN); Shi Shu, Beijing (CN); Qi Yao, Beijing (CN); Guangcai Yuan, Beijing (CN); Chuanxiang Xu, Beijing (CN); Yang Yue, Beijing (CN); Haitao Huang, Beijing (CN); Xiang Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 94 days.

(21) Appl. No.: 17/628,516

(22) PCT Filed: Mar. 9, 2021

(86) PCT No.: PCT/CN2021/079691
§ 371 (c)(1),
(2) Date: Jan. 19, 2022

(87) PCT Pub. No.: WO2021/213033
PCT Pub. Date: Oct. 28, 2021

(65) Prior Publication Data
US 2022/0278174 A1 Sep. 1, 2022

(30) Foreign Application Priority Data
Apr. 21, 2020 (CN) .......................... 202010318261.3

(51) Int. Cl.
*H10K 59/38* (2023.01)
*G02F 1/1343* (2006.01)
(Continued)

(52) U.S. Cl.
CPC ....... *H10K 59/38* (2023.02); *G02F 1/133504* (2013.01); *G02F 1/133512* (2013.01);
(Continued)

(58) Field of Classification Search
CPC ............. G02F 2/02; G02F 2001/01791; G02F 1/133614; G02F 2202/046; H01L 33/50;
(Continued)

(56) References Cited

U.S. PATENT DOCUMENTS

| 2009/0008142 A1 | 1/2009 | Shimizu et al. |
| 2015/0048348 A1 | 2/2015 | Huang et al. |

(Continued)

FOREIGN PATENT DOCUMENTS

| CN | 202633384 U | 12/2012 |
| CN | 104377226 A | 2/2015 |

(Continued)

OTHER PUBLICATIONS

CN202010318261.3 first office action.

*Primary Examiner* — Jonathan Y Jung
(74) *Attorney, Agent, or Firm* — IPro, PLLC

(57) ABSTRACT

Provided are a display apparatus and a manufacturing method therefor, the display apparatus comprising: a plurality of mutually independent subpixel regions; a light source (101), light emitted from the light source (101) illuminating the subpixel regions; and a light control layer (102), which is located on a light exiting side of the light source (101), the light control layer (102) comprising: color conversion structures (1021) located at the subpixel regions, the color conversion structures (1021) each comprising a nanoporous material and at least a color conversion material distributed among the nanoporous material, the color conversion material being used to convert light emitted from the (Continued)

light source (101) into light of a color corresponding to the subpixel region where the light is located.

13 Claims, 3 Drawing Sheets

(51) Int. Cl.
*G02F 1/1335* (2006.01)
*G02F 1/13357* (2006.01)
*H10K 50/86* (2023.01)
*H10K 59/122* (2023.01)
*H10K 59/12* (2023.01)
*G02F 1/1362* (2006.01)

(52) U.S. Cl.
CPC .. *G02F 1/133514* (2013.01); *G02F 1/133603* (2013.01); *G02F 1/133621* (2013.01); *G02F 1/134345* (2021.01); *H10K 50/865* (2023.02); *G02F 1/1362* (2013.01); *G02F 2201/52* (2013.01); *G02F 2202/046* (2013.01); *G02F 2202/36* (2013.01); *H10K 59/1201* (2023.02); *H10K 59/122* (2023.02)

(58) Field of Classification Search
CPC ..... H01L 33/507; H01L 27/322; H10K 59/38; H05B 33/145; B82Y 30/00; C01P 2004/64
See application file for complete search history.

(56) References Cited

U.S. PATENT DOCUMENTS

| | | | |
|---|---|---|---|
| 2016/0370655 A1* | 12/2016 | Nagayama | G02F 1/133617 |
| 2017/0003423 A1 | 1/2017 | Jiang et al. | |
| 2018/0011231 A1 | 1/2018 | Jiang et al. | |
| 2019/0004369 A1* | 1/2019 | Pousthomis | G02F 1/133617 |
| 2019/0212612 A1 | 7/2019 | Li | |
| 2019/0267357 A1 | 8/2019 | Iguchi et al. | |
| 2019/0377223 A1 | 12/2019 | Keun et al. | |
| 2020/0043976 A1 | 2/2020 | Kim et al. | |
| 2020/0105838 A1* | 4/2020 | Kim | H10K 59/38 |
| 2020/0152841 A1 | 5/2020 | Han et al. | |
| 2020/0185638 A1* | 6/2020 | Choi | H10K 50/824 |
| 2021/0191198 A1* | 6/2021 | Musa | C09B 3/10 |
| 2021/0335893 A1* | 10/2021 | Baek | H10K 59/12 |

FOREIGN PATENT DOCUMENTS

| | | |
|---|---|---|
| CN | 104932136 A | 9/2015 |
| CN | 105204104 A | 12/2015 |
| CN | 205067782 U | 3/2016 |
| CN | 107037630 A | 8/2017 |
| CN | 108192418 A | 6/2018 |
| CN | 109669301 A | 4/2019 |
| CN | 110211986 A | 9/2019 |
| CN | 110808260 A | 2/2020 |
| CN | 111052418 A | 4/2020 |
| CN | 111505866 A | 8/2020 |

* cited by examiner

DISPLAY APPARATUS AND MANUFACTURING METHOD THEREFOR

CROSS REFERENCE TO RELATED APPLICATIONS

The present application is a National Stage of International Application No. PCT/CN2021/079691, filed on Mar. 9, 2021, which claims priority to Chinese Patent Application No. 202010318261.3, filed to the China Patent Office on Apr. 21, 2020 and entitled "DISPLAY APPARATUS AND MANUFACTURING METHOD THEREFOR", the entire contents of which are incorporated herein by reference.

FIELD

The present disclosure relates to the technical field of display, in particular to a display apparatus and a manufacturing method thereof.

BACKGROUND

With the vigorous development of display technologies, display products have invaded our lives at lightning speed. The high color gamut of the display products means that a display screen has more colorful colors and stronger color display capacity, which has become an important development direction.

SUMMARY

A display apparatus provided by an embodiment of the present disclosure, includes:
- a plurality of mutually independent sub-pixel regions;
- a light source, wherein light emitted from the light source illuminates the sub-pixel regions; and
- a light control layer, located on a light emitting side of the light source, wherein the light control layer includes: color conversion structures located in the sub-pixel regions, the color conversion structures include nanoporous materials and color conversion materials at least distributed in the nanoporous materials, and the color conversion materials are used to convert the light emitted from the light source into light of colors corresponding to the sub-pixel regions where the color conversion materials are located.

Optionally, in the display apparatus provided by embodiments of the present disclosure, the color conversion materials are further located on a side, facing away from the light source, of a layer where the nanoporous materials are located.

Optionally, in the display apparatus provided by embodiments of the present disclosure, the sub-pixel regions include: blue sub-pixel regions, red sub-pixel regions and green sub-pixel regions;
- the color conversion structures are located in the red sub-pixel regions and the green sub-pixel regions, and the color conversion materials include: a red organic fluorescent dye located in the red sub-pixel regions, and a green organic fluorescent dye located in the green sub-pixel regions; and
- the light control layer further includes: light scattering structures located in the blue sub-pixel regions.

Optionally, the display apparatus provided by embodiments of the present disclosure further includes: a color resist layer located on a side, facing away from the light source, of the light control layer and located in the sub-pixel regions, wherein an orthographic projection of the light control layer in each sub-pixel region is located within an orthographic projection of the color resist layer in each sub-pixel region.

Optionally, the display apparatus provided by embodiments of the present disclosure further includes: a drive backplane and lens structures, wherein
- the light source is located on the drive backplane, the light source includes a plurality of blue diode chips, the color conversion structures and the light scattering structures cover the blue diode chips, and the lens structures are located between the light control layer and the color resist layer.

Optionally, in the display apparatus provided by embodiments of the present disclosure, a refractive index of each lens structure is 1.5-1.7, and a maximum distance between a surface, in contact with the color conversion structures, of each lens structure and a surface, in contact with the color resist layer, of each lens structure is 1 μm-2 μm.

Optionally, the display apparatus provided by embodiments of the present disclosure further includes: retaining walls located between the adjacent color conversion structures and/or light scattering structures, wherein
- a slope angle of the retaining walls is 85°-90°, surface reflectivity of the retaining walls is 70%-100%, and in a direction perpendicular to a plane where the drive backplane is located, a height of the retaining walls is greater than a height of the blue diode chips.

Optionally, in the display apparatus provided by embodiments of the present disclosure, the light source includes blue electroluminescent devices located in the sub-pixel regions, and the display apparatus further includes: an encapsulation layer located between a layer where the blue electroluminescent devices are located and the light control layer, and a first black matrix located between the encapsulation layer and the light control layer; and
- an orthographic projection of the first black matrix on a plane where the display apparatus is located partially overlaps an orthographic projection of the light control layer, and a height of the first black matrix is smaller than a height of the light control layer in a direction perpendicular to the plane where the display apparatus is located.

Optionally, the display apparatus provided by embodiments of the present disclosure further includes: a second black matrix located on a side, facing away from the encapsulation layer, of the first black matrix, wherein
- an orthographic projection of the second black matrix on the plane where the display apparatus is located and an orthographic projection of the color resist layer do not overlap each other, and a height of the second black matrix is smaller than a height of the color resist layer in the direction perpendicular to the plane where the display apparatus is located.

Optionally, in the display apparatus provided by embodiments of the present disclosure, the light source includes blue electroluminescent devices located in the sub-pixel regions, and the display apparatus further includes: a display substrate and a first color filter substrate disposed oppositely;
- the display substrate includes: the blue electroluminescent devices;
- the first color filter substrate includes: a first base substrate, a color resist layer and a third black matrix located on the first base substrate, and a light control layer located on a side, facing away from the first base substrate, of the color resist layer; and a boundary of an orthographic projection of the third black matrix on the first base substrate and a boundary of an orthographic projection of the color resist layer overlap each other, and a height of the third black matrixe is the same as a height of the color resist layer in a direction perpendicular to the first base substrate.

Optionally, the display apparatus provided by embodiments of the present disclosure further includes: a fourth black matrix, located on a side, facing away from the first base substrate, of the third black matrix, wherein a boundary of an orthographic projection of the fourth black matrix on the first base substrate and a boundary of an orthographic projection of the light control layer overlap each other, and a height of the fourth black matrix is the same as a height of the light control layer in the direction perpendicular to the first base substrate.

Optionally, in the display apparatus provided by embodiments of the present disclosure, the light source is a blue backlight source, and the display apparatus further includes: an array substrate and a second color filter substrate disposed oppositely, and a liquid crystal layer located between the array substrate and the second color filter substrate;

the second color filter substrate includes: a second base substrate, a color resist layer and a fifth black matrix sequentially located on the second base substrate, and a light control layer located on a side, facing away from the second base substrate, of the color resist layer; and an orthographic projection of the fifth black matrix on the second base substrate partially overlaps an orthographic projection of the color resist layer, and a height of the fifth black matrix is smaller than a height of the color resist layer in a direction perpendicular to the second base substrate.

Optionally, the display apparatus provided by the embodiment of the present disclosure further includes: a sixth black matrix located on a side, facing away from the second base substrate, of the fifth black matrix, wherein an orthographic projection of the sixth black matrix on the second base substrate partially overlaps an orthographic projection of the light control layer, and a surface of a side, facing away from the second base substrate, of the sixth black matrix is flush with a surface of a side, facing away from the second base substrate, of the light control layer.

Optionally, in the display apparatus provided by embodiments of the present disclosure, the light source includes blue electroluminescent devices located in the sub-pixel regions, the display apparatus further includes: a light shielding layer located on a side, facing away from a layer where the blue electroluminescent devices are located, of the color resist layer, and an orthographic projection of the light shielding layer on a plane where the display apparatus is located does not overlap an orthographic projection of the color resist layer.

Based on the same inventive concept, an embodiment of the present disclosure further provides a manufacturing method of a display apparatus, including:

providing a light source; and forming a light control layer on a light emitting side of the light source, wherein the display apparatus has a plurality of mutually independent sub-pixel regions, the light control layer includes: color conversion structures located in the sub-pixel regions, the color conversion structures include nanoporous materials and color conversion materials at least distributed in the nanoporous materials, and the color conversion materials are used to convert light emitted from the light source into light of colors corresponding to the sub-pixel regions where the color conversion materials are located.

Optionally, in the above manufacturing method provided by embodiments of the present disclosure, the forming the light control layer specifically includes:

mixing the nanoporous materials and the color conversion materials, and forming the light control layer by using the mixed materials; or, forming a nanoporous material layer, forming a photoresist layer including the color conversion materials on the nanoporous material layer, and obtaining the light control layer by patterning the photoresist layer.

DETAILED DESCRIPTION OF THE EMBODIMENTS

Figure 1:
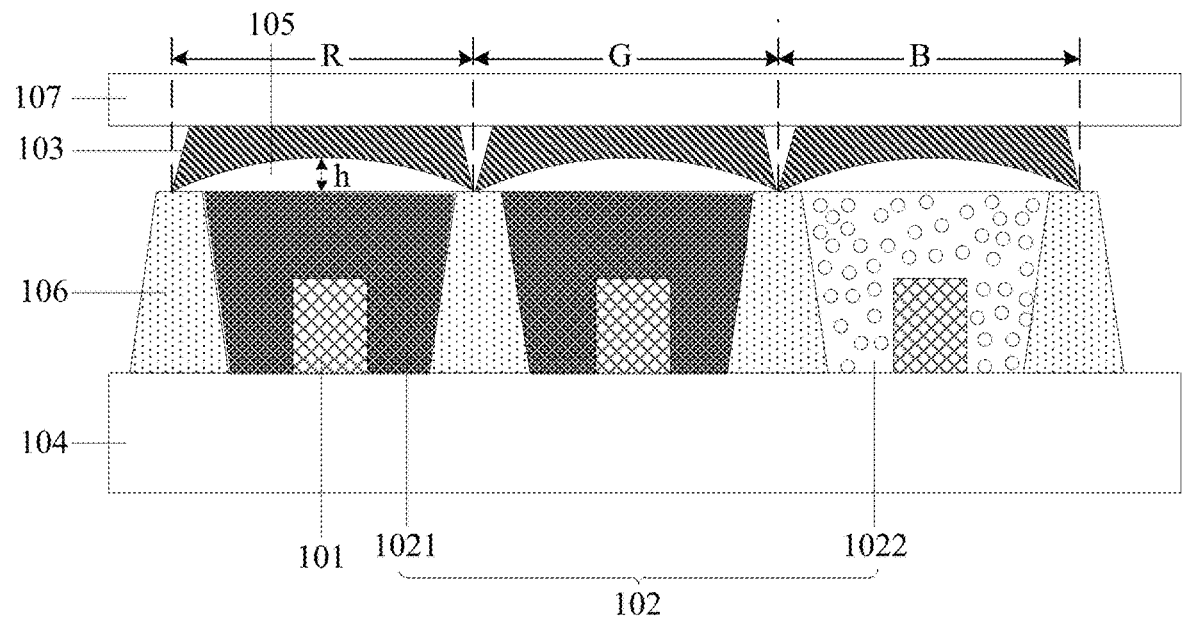
FIG. 1 is a schematic structural diagram of a display apparatus provided by an embodiment of the present disclosure.

In order to make the objectives, technical solutions, and advantages of embodiments of the present disclosure clearer, the technical solutions of the embodiments of the present disclosure will be described clearly and completely with reference to accompanying drawings of the embodiments of the present disclosure. The sizes and shapes of figures in the drawings do not reflect true scales, and are intended only to schematically illustrate the present disclosure.

The same or similar reference numerals refer to the same or similar elements or elements having the same or similar functions throughout. Obviously, the described embodiments are part of, rather than all of, embodiments of the present disclosure. Based on the described embodiments of the present disclosure, all other embodiments obtained by those ordinarily skilled in the art without creative labor fall within the scope of the present disclosure.

Unless otherwise defined, technical or scientific terms used herein shall have the ordinary meanings as understood by those with ordinary skills in the art to which the present disclosure belongs. "First", "second" and similar words used in the description and claims of the present disclosure do not indicate any order, quantity or importance, but are only used to distinguish different components. "Comprise" or "include" or other similar words mean that the element or item appearing before the word encompasses the element or item listed after the word and its equivalents, but does not exclude other elements or items. "Inner", "outer", "upper", "lower", etc. are only used to indicate a relative position relationship which may change accordingly when the absolute position of an object being described changes.

At present, organic light-emitting device (OLED) display products have advantages of high resolution, high color gamut, low power consumption and so on compared with traditional liquid crystal display (LCD) products, and their share in display products is increasing. It is foreseeable that the development will continue to accelerate in the future. The current development trend of OLED includes high resolution, high color gamut, low power consumption, etc. At present, the main structure of a large-size OLED mass-produced product is white OLED (WOLED) combined with a color filter (CF). However, due to the overlap problem of the CF, the color gamut of the OLED products is generally less than 90% NTSC color gamut standard. In order to cope with the high color gamut standard, it is difficult to start from improving the quality of the CF.

Quantum dot (QD) display technology belongs to the innovative semiconductor nanocrystal technology, which can accurately transmit light, efficiently improve a color gamut value and viewing angle of a display screen, make colors purer and brighter, and make color performance tenser. Displays using this technology can not only produce dynamic colors with a wider range of color gamut, but also show real color palettes in image quality, surpassing the traditional backlight technology. There have been display products combining WOLED with QD and CF structures in the related art, but the color conversion efficiency of a QD material is low, which affects application and popularization of such display products.

In response to the above problems in the related art, embodiments of the present disclosure provide a display apparatus and a manufacturing method thereof.

A display apparatus provided by an embodiment of the present disclosure, as shown in FIGS. 1 to 5, includes:
- a plurality of mutually independent sub-pixel regions, where exemplarily, FIGS. 1 to 5 show mutually independent red sub-pixel regions R, green sub-pixel regions G, and blue sub-pixel regions B; and in some embodiments, the display apparatus may further include sub-pixel regions of other colors, which is not limited here;
- a light source 101, where light emitted by the light source 101 illuminates each sub-pixel region; and
- a light control layer 102, located on a light emitting side of the light source 101. The light control layer 102 includes: color conversion structures 1021 located in the sub-pixel regions. The color conversion structures 1021 include nanoporous materials and color conversion materials at least distributed in the nanoporous materials. The color conversion materials are used to convert the light emitted by the light source 101 into light of colors corresponding to the sub-pixel regions where the color conversion materials are located.

In the above display apparatus provided by embodiments of the present disclosure, since a size of the nanoporous materials is between 10 nm and 100 nm, the microscopic size is small and the specific surface area is large, light will have a strong scattering effect inside nanopores, and an effective light path in the propagation process will be greatly enhanced. When the color conversion materials are distributed in the porous materials, the absorption rate of the light emitted from the light source 101 by the color conversion materials may be increased, and the color conversion efficiency of the color conversion materials may be greatly improved. At the same time, the surface enhancement effect of most nanoporous materials may also enhance fluorescence excitation characteristics and improve the luminous efficiency of the color conversion materials. Moreover, it can be understood that because the color conversion efficiency of the color conversion materials is greatly improved, the light control layer 102 with a low film thickness may achieve high luminous efficiency, thereby reducing a film thickness of a fluorescent material and saving costs.

It should be noted that the above display apparatus provided by the embodiment of the present disclosure may be: an LCD display apparatus, an OLED display apparatus, a micro light emitting diode (micro LED) device apparatus, a mini light emitting diode (mini LED) display apparatus, etc.

In some embodiments, when the display apparatus is an LCD, the light source 101 is a side-entry backlight or a direct-type backlight. When the display apparatus is an OLED, the light source 101 is an OLED device. When the display apparatus is a micro LED, the light source 101 is a micro LED chip. When the display apparatus is a mini LED, the light source 101 is a mini LED chip.

In the related art, the color conversion materials are mostly materials that may absorb blue light and convert it into red or green light. Therefore, the light source 101 may be a white light source or a blue light source. When the light source 101 is the white light source, the color conversion material of each sub-pixel region may only convert light of part of wavelengths in the white light source into light of a color corresponding to the sub-pixel region, so the utilization rate of the light source 101 is low. When the light source 101 is the blue light source, the color conversion material of each sub-pixel region may convert light of all wavelengths in the blue light source into light of a color corresponding to the sub-pixel region. Therefore, the light source 101 is preferably the blue light source in the present disclosure.

The color conversion materials may be quantum dot (QD) materials or organic fluorescent dyes. The QD material contains toxic metals such as cadmium (Cd), and cannot be used commercially. The luminous efficiency of a Cd-free QD material is much lower than that of a Cd-containing QD material, the QD material itself is extremely afraid of water and oxygen, and its performance at a high temperature may degrade much. In addition, a manufacturing method of the color conversion structures 1021 in the present disclosure involves the process steps of mixing the color conversion materials with photoresist, or mixing the color conversion materials, the nanoporous materials, and the photoresist. Generally, the solubility of QD and the photoresist is poor, while the organic fluorescent dyes do not contain heavy metals and belong to the same organic material as the photoresist, so the two are well compatible, and the problem of poor dispersion stability does not exist, which is conducive to formulating for photolithography or printing. Based on this, the organic fluorescent dyes are preferably used as the color conversion materials in the present disclosure.

In the related art, the absorption spectra of a red organic fluorescent dye are located at 430 nm-580 nm and 580 nm-660 nm. The red organic fluorescent dye may absorb blue and green light and convert them into red light, and mainly has the following categories: perylene red series, CF 488A, Alexa Fluor 488, FAM, DyLight 488, and Cy2. Taking a perylene red dye as an example, its structure is a core skeleton: perylene diimide, and through performing different modifications on several bay positions and grafting different substituents, synthesis of fluorescent dyes with different colors and different properties may be realized. The absorption spectrum of a green organic fluorescent dye is located at 430 nm-580 nm, and the green organic fluorescent dye may absorb blue light and convert it into green light, and mainly includes Alexa Fluor 430, Lucifer yellow, etc. In addition, the central wavelength of the absorption spectrum of the green organic fluorescent dye may reach 520 nm, which meets the requirements of high color purity. The efficiency of green indium phosphide (InP) QD excitation wavelengths below 530 nm is seriously degraded. Therefore, the organic fluorescent dyes have high luminous efficiency and high color conversion efficiency, and are more suitable for display products than the QD material.

In the related art, Micro LED and mini LED products adopt red LED chips, green LED chips, and blue LED chips to realize full-color display, while costs of the red LED chips and the green LED chips are high. In the present disclosure, full-color display may be realized by combining the blue LED chips with the color conversion materials, which may greatly reduce the chip cost and improve the efficiency and yield of massive transfer chips. Moreover, even if the LED chips generate a large amount of heat, the high-temperature resistance of the organic fluorescent materials may well ensure the color conversion rate and maintain white balance.

Figure 6:
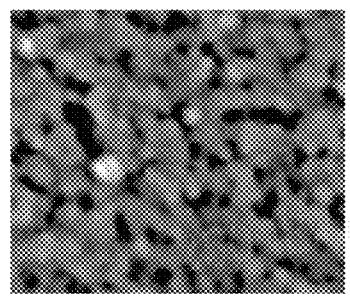
FIG. 6 is a picture of nanoporous silica glass in the related art.
Figure 7:
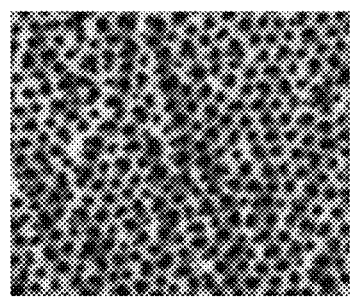
FIG. 7 is a picture of a nanoporous aluminum film in the related art.

In addition, in the above display apparatus provided by embodiments of the present disclosure, the nanoporous materials may be organic nanoporous materials, or inorganic porous materials, or metal nanoporous materials, which is not limited herein. In some embodiments, the nanoporous materials may be nanoporous carbon, nanoporous gold, nanoporous silver, nanoporous silica glass (as shown in FIG. 6), nanoporous alumina films (as shown in FIG. 7), etc.

In some embodiments, in the above display apparatus, the nanoporous materials and the color conversion materials may be mixed, and the mixed materials may be used to form the light control layer. In this case, the color conversion materials may be evenly distributed in pores of the nanoporous materials. It is also possible to first form a nanoporous material layer, then form a photoresist layer including color conversion materials on the nanoporous material layer, and finally pattern the photoresist layer to obtain the light control layer. In this case, the fluidity of the photoresist layer including the color conversion materials may cause part of the color conversion materials to be distributed in the pores of the nanoporous materials, and the rest of the color conversion materials to be located on a layer where the nanoporous materials are located. Therefore, in the above display apparatus provided by embodiments of the present disclosure, the color conversion materials may also be located on a side, facing away from the light source, of the layer where the nanoporous materials are located (i.e., being located on the layer where the nanoporous materials are located).

In some embodiments, as shown in FIGS. 1 to 5, the sub-pixel regions include: blue sub-pixel regions B, red sub-pixel regions R, and green sub-pixel regions G.

The color conversion structures 1021 are located in the red sub-pixel regions R and the green sub-pixel regions G. The color conversion materials include: red organic fluorescent dyes located in the red sub-pixel regions and green organic fluorescent dyes located in the green sub-pixel regions.

The light control layer 102 further includes: light scattering structures 1022 located in the blue sub-pixel regions B.

The red organic fluorescent dyes absorb blue light and green light and convert them into red light, and the green organic fluorescent dyes absorb blue light and convert it into green light, which is equivalent to generating self-luminescence on the color conversion structures 1021, and self-luminescence radiates in all directions. Therefore, the light scattering structures 1022, which are essentially a diffuser layer, are disposed in the blue sub-pixel regions B to scatter light of the blue sub-pixel regions B to match the viewing angle and white balance of devices. Generally, in order to better match the viewing angle and white balance of the red sub-pixel regions R, the green sub-pixel regions G, and the blue sub-pixel regions B, scattering particles may also be disposed in the color conversion structures 1021.

In some embodiments, the above display apparatus, as shown in FIGS. 1 to 5, may further include: a color resist layer 103 located on a side, facing away from the light source 101, of the light control layer 102 and located in the sub-pixel regions. Orthographic projections of the light control layer 102 in the sub-pixel regions are located within orthographic projections of the color resist layer 103 in the sub-pixel regions.

By adopting the design that the orthographic projection of the color resist layer 103 in each sub-pixel region covers the orthographic projection of the light control layer 102 in each sub-pixel region, the problem that as the color conversion structures 1021 of the light control layer 102 may not completely convert blue light, light leakage and color gamut reduction are caused may be avoided, and thus display requirements are met. In some embodiments, the color resist layer 103 may be color filters, and the color filters generally include red filters located in the red sub-pixel regions R, green filters located in the green sub-pixel regions G, and blue filters located in the blue sub-pixel regions B.

In some embodiments, when the above display apparatus provided is the micro LED or the mini LED, as shown in FIG. 1, it may further include: a drive backplane 104 and lens structure 105.

The light source 101 is located on the drive backplane 104. The light source 101 includes a plurality of blue diode chips, and the color conversion structures 1021 and the light scattering structures 1022 cover the blue diode chips to ensure the luminous efficiency. The lens structures 105 are located between the light control layer 102 and the color resist layer 103.

The red organic fluorescent dyes absorb red light converted from blue light and green light, the green organic fluorescent dyes absorb green light converted from blue light, and scattering particles scatter the blue light, so light in each sub-pixel region is diffused in all directions, and the viewing range is large. By providing the lens structures 105, red light in the red sub-pixel regions R, green light in the green sub-pixel regions G, and blue light in the blue sub-pixel regions B may be converged to a positive viewing angle, thereby improving light emitting efficiency and realizing privacy display application.

In some embodiments, in the above display apparatus, in order to better converge light to the positive viewing angle, the refractive index of the lens structures 105 is 1.5-1.7, for example, 1.5, 1.6 and 1.7. The maximum distance (namely, an arch height h of the lens structure 105, as shown in FIG. 1) between a surface, in contact with the color conversion structures 1021, of each lens structure 105 and a surface, in contact with the color resist layer 103, of each lens structure 105 is 1 µm-2 µm, for example, 1 µm, 1.1 µm, 1.2 µm, 1.3 µm, 1.4 µm, 1.5 µm, 1.6 µm, 1.7 µm, 1.8 µm, 1.9 µm, and 2 µm.

In some embodiments, the above display apparatus, as shown in FIG. 1, further includes: retaining walls 106 located between the adjacent color conversion structures 1021 and/or light scattering structures 1022.

The slope angle of the retaining walls 106 is 85°-90°, for example, 85°, 86°, 87°, 88°, 89° and 90°. The surface reflectivity of the retaining walls 106 is 70%-100%, for example, 70%, 75%, 80%, 85%, 90%, 95% and 100%. In a direction perpendicular to a plane where the drive backplane 104 is located, the height of the retaining walls 106 is greater than the height of the blue diode chips.

The retaining walls 106 may greatly reduce the loss of light, at the same time, may prevent color mixing between adjacent pixels, and may also converge light to the positive viewing angle to a certain extent, further improving the anti-peeping effect.

In some embodiments, when the above display apparatus is the micro LED or the mini LED, as shown in FIG. 1, it may further include: a first protective cover plate 107 located above the color resist layer 103. The color resist layer 103 is made on the first protective cover plate 107 by using a high temperature process of 170° C. or 230° C.

Figure 2:
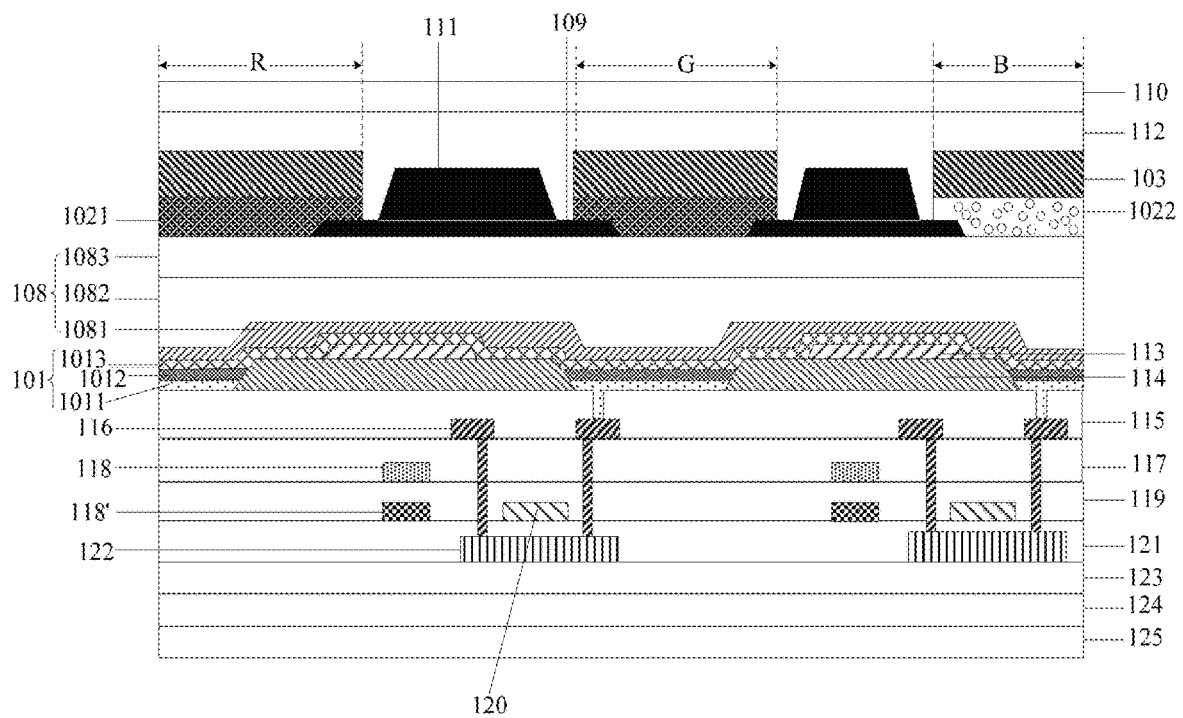
FIG. 2 is another schematic structural diagram of a display apparatus provided by an embodiment of the present disclosure.

In some embodiments, when the above display apparatus is a top-emission OLED, as shown in FIG. 2, the light source 101 includes blue electroluminescent devices located in each sub-pixel region, and the display apparatus may further include: an encapsulation layer 108 located between a layer where the blue electroluminescent devices are located and the light control layer 102, and a first black matrix 109 located between the encapsulation layer 108 and the light control layer 102.

An orthographic projection of the first black matrix 109 on a plane where the display apparatus is located partially overlaps an orthographic projection of the light control layer 102, and the height of the first black matrix 109 is smaller than that of the light control layer 102 in a direction perpendicular to the plane where the display apparatus is located.

Since the light control layer 102 is located in each sub-pixel region, and the orthographic projection of the first black matrix 109 on the plane where the display apparatus is located partially overlaps with the orthographic projection of the light control layer 102, which is equivalent to disposing the light control layer 102 on opening regions of the first black matrix 109, the first black matrix 109 may avoid the light crosstalk of the red sub-pixel regions R, the green sub-pixel regions G, and the blue sub-pixel regions B, and improve the display effect.

In some embodiments, as shown in FIG. 2, the blue electroluminescent devices include anodes 1011 disposed in each sub-pixel region, a blue light emitting layer 1012 located above the anodes 1011, and cathodes 1013 located above the blue light emitting layer 1012 and disposed on a whole surface. In some embodiments, the blue light emitting layer 1012 may be only disposed in each sub-pixel region, or may be disposed on the whole surface. Of course, the blue electroluminescent devices may further include a hole injection layer, a hole transport layer, an electron blocking layer, a hole blocking layer, an electron transport layer, and an electron injection layer, which is not specifically limited here.

In addition, as shown in FIG. 2, the encapsulation layer 108 includes a first inorganic encapsulation layer 1081, an organic encapsulation layer 1082, and a second inorganic encapsulation layer 1083 that are sequentially located on the cathodes 1013. The OLED display apparatus generally may further include a second protective cover plate 110 at the top. The light control layer 102 is disposed between the second inorganic encapsulation layer 1083 and the second protective cover plate 110 in an on cell manner. In order to ensure electroluminescence (EL) performance, the light control layer 102 needs to use a low temperature process of 85° C.

In some embodiments, the above display apparatus, as shown in FIG. 2, may further include: a second black matrix 111 located on a side, facing away from the encapsulation layer 108, of the first black matrix 109.

An orthographic projection of the second black matrix 111 on the plane where the display apparatus is located and an orthographic projection of the color resist layer 103 do not overlap each other, and the height of the second black matrix 111 is less than the height of the color resist layer 103 in the direction perpendicular to the plane where the display apparatus is located.

By providing the second black matrix 111, the surface reflectivity may be reduced, and at the same time, since the color resist layer 103 in each sub-pixel region is located in opening regions of the second black matrix 111, the transmittance and aperture ratio may also be prevented from being reduced.

In addition, it can be seen from FIG. 2 that the color resist layer 103 is disposed between the second inorganic encapsulation layer 1083 and the second protective cover plate 110 in an on cell manner. Similarly, in order to ensure the electroluminescence (EL) performance, the color resist layer 103 needs to use a low temperature process of 85° C.

In some embodiments, when the above display apparatus is the top-emission OLED, as shown in FIG. 2, it may further include an insulating (OC) layer 112, a post spacer (PS) layer 113, a pixel defining layer (PDL) 114, a planar (PLN) layer 115, sources and drains 116, an interlayer dielectric (ILD) layer 117, first capacitor electrodes 118, a first gate insulating (GI1) layer 119, gates 120 and second capacitor electrodes 118' which are disposed in the same layer, a second gate insulating (GI2) layer 121, an active layer 122 (including a semiconductor region shielded by the gates 120 and conductor regions located on both sides of the semiconductor region), a flexible (PI) base 123, a buffer (PSA) layer 124, and a base film substrate 125.

Figure 3:
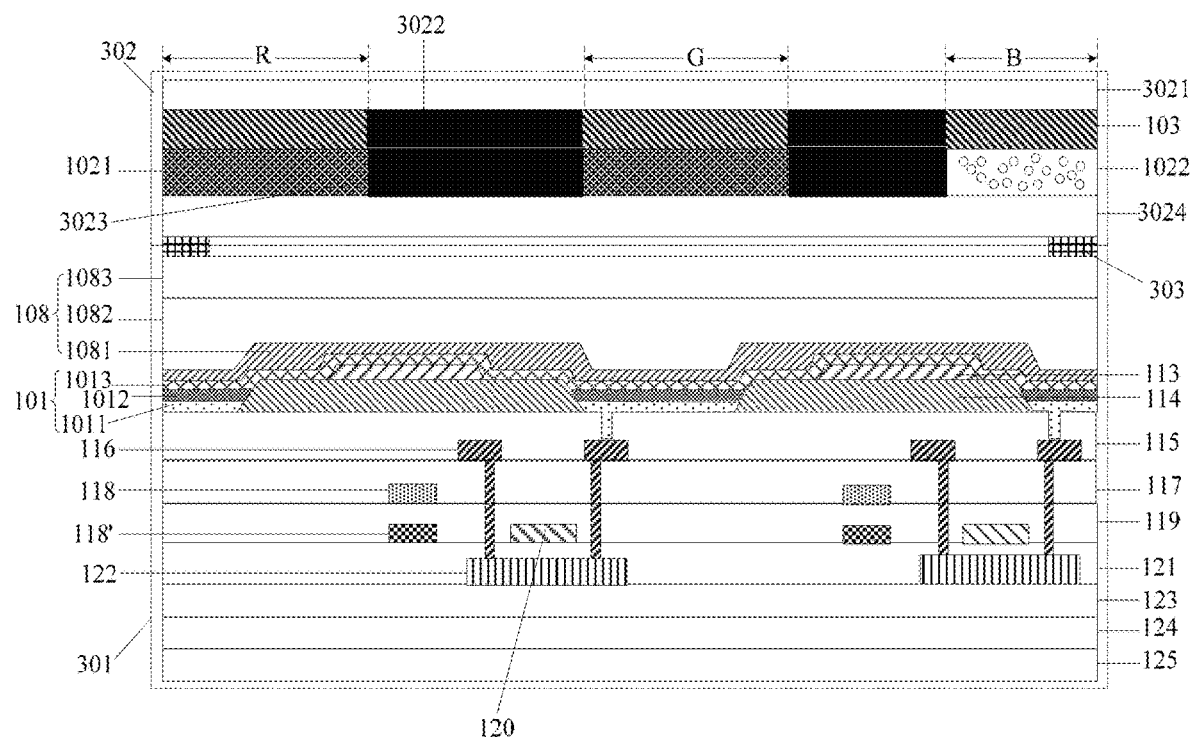
FIG. 3 is yet another schematic structural diagram of a display apparatus provided by an embodiment of the present disclosure.

In some embodiments, when the above display apparatus is the top-emission OLED, as shown in FIG. 3, the light source 101 includes blue electroluminescent devices located in each sub-pixel region, and the display apparatus may further include: a display substrate 301 and a first color filter substrate 302 disposed oppositely. In some embodiments, the display substrate 301 and the first color filter substrate 302 may be assembled together through a sealant 303.

The display substrate 301 includes: the blue electroluminescent devices.

The first color filter substrate 302 includes: a first base substrate 3021, a color resist layer 103 and a third black matrix 3022 located on the first base substrate 3021 in sequence, and a light control layer 102 located on a side, facing away from the first base substrate 3021, of the color resist layer 103.

A boundary of an orthographic projection of the third black matrix 3022 on the first base substrate 3021 and a boundary of an orthographic projection of the color resist layer 103 overlap each other, and in a direction perpendicular to the first base substrate 3021, the height of the third black matrixe 3022 is the same as the height of the color resist layer 103.

By disposing the color resist layer 103 of each sub-pixel region in opening regions of the third black matrix 3022, light emitted from a side surface of the color resist layer 103 of the adjacent sub-pixel regions may be covered by the third black matrix 3022 therebetween, thereby effectively avoiding the light crosstalk of the red sub-pixel regions R, the green sub-pixel regions G, and the blue sub-pixel regions B, and improving the display effect.

It should be noted that, as shown in FIG. 3, the structure of the blue electroluminescent devices here is the same as the above blue electroluminescent devices, which will not be repeated here. Besides, generally, the display substrate 301 further includes the above film layers from the base film substrate 125 to the encapsulation layer 108, which will not be repeated here.

In some embodiments, the above display apparatus, as shown in FIG. 3, may further include: a fourth black matrix 3023 located on a side, facing away from the first base substrate 3021, of the third black matrix 3022.

A boundary of an orthographic projection of the fourth black matrix 3023 on the first base substrate 3021 and a boundary of an orthographic projection of the light control layer 102 overlap each other, and in the direction perpendicular to the first base substrate 3021, the height of the fourth black matrix 3023 is the same as the height of the light control layer 102.

The light control layer 102 is located in opening regions of the fourth black matrix 3023, so that light emitted from a side surface of the light control layer 102 in the different sub-pixel regions may be effectively blocked by the fourth black matrix 3023. Based on this, the fourth black matrix 3023 may further avoid the light crosstalk of the red sub-pixel regions R, the green sub-pixel regions G, and the blue sub-pixel regions B, and improve the display effect.

The structure shown in FIG. 3 may be applied to large-size top-emission OLED products. The light control layer 102 and the color resist layer 103 are both manufactured on the first base substrate 3021, and the light control layer 102 and the color resist layer 103 use a high temperature process of 170° C. or 230° C., where 230° C. is consistent with temperature of an existing color filter (CF) manufacturing process.

Figure 4:
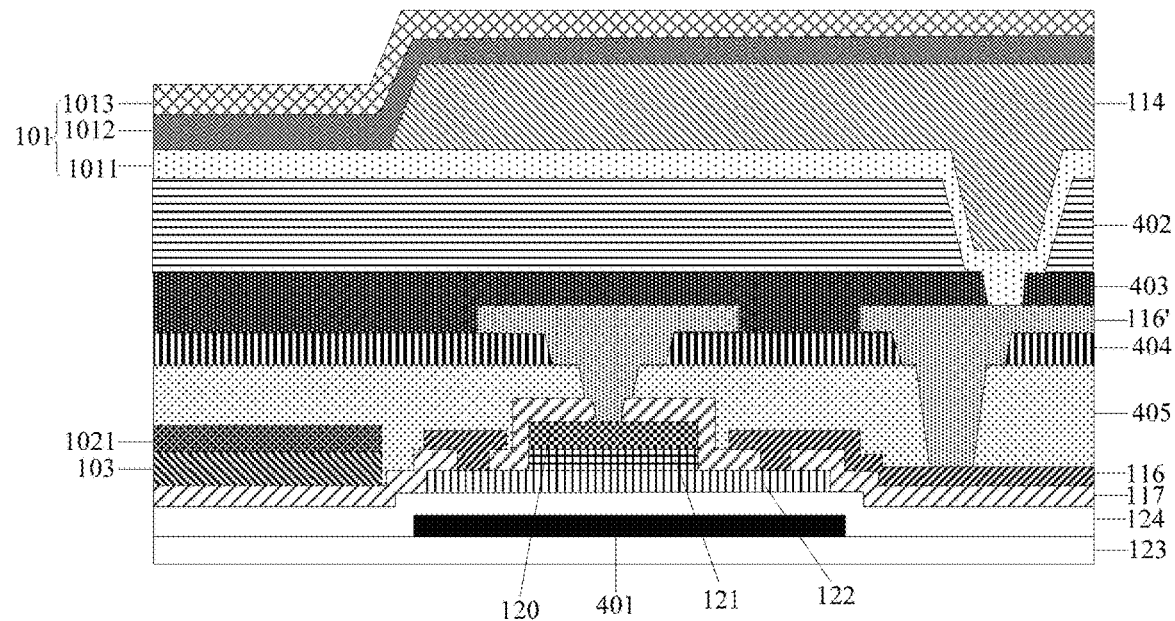
FIG. 4 is yet another schematic structural diagram of a display apparatus provided by an embodiment of the present disclosure.

In some embodiments, when the above display apparatus is a bottom-emission OLED, as shown in FIG. 4, the light source 101 includes blue electroluminescent devices located in each sub-pixel region, and the display apparatus may further include: a light shielding layer 401 located on a side, facing away from a layer where the blue electroluminescent devices are located, of a color resist layer 103. An orthographic projection of the light shielding layer 401 on the plane where the display apparatus is located and an orthographic projection of the color resist layer 103 do not overlap each other.

The light shielding layer 401 may avoid light crosstalk of red sub-pixel regions R, green sub-pixel regions G, and blue sub-pixel regions B, and improve the display effect. Further, as shown in FIG. 4, the bottom-emission OLED provided by embodiments of the present disclosure further includes: an active layer 122 (including a semiconductor region shielded by gates 120 and conductive regions located on both sides of the semiconductor region). The light shielding layer 401 completely covers the active layer 122, avoiding the interference of external light on the active layer 122. In addition, as shown in FIG. 4, the bottom-emission OLED provided by the embodiment of the present disclosure further includes: a pixel definition layer (PDL) 114, a first resin (Resin1) layer 402, a first passivation (PVX1) layer 403, a second passivation (PVX2) layer 404, sub sources and drains 116' (including first parts covering the active layer 122 and electrically connected with the gates 120 to prevent light from the blue light emitting devices from illuminating the active layer 122, and second parts electrically connected with the drains and the anodes 1011), a second resin (Resin2) layer 405, an interlayer dielectric (ILD) layer 117, a second gate insulating layer 121, a buffer (PSA) layer 124 and a flexible (PI) substrate 123.

The above bottom-emission OLED display apparatus provided by the present disclosure may be a large-size bottom-emission OLED product. Color conversion structures 1021 and the color resist layer 103 are both disposed on a drive backplane, and specifically, a high-temperature process of 230° C. may be used to form the color conversion structures 1021 and the color resist layer 103. The high temperature of 230° C. may weaken the luminescence performance of a QD material, and is not suitable for the QD material.

Figure 5:
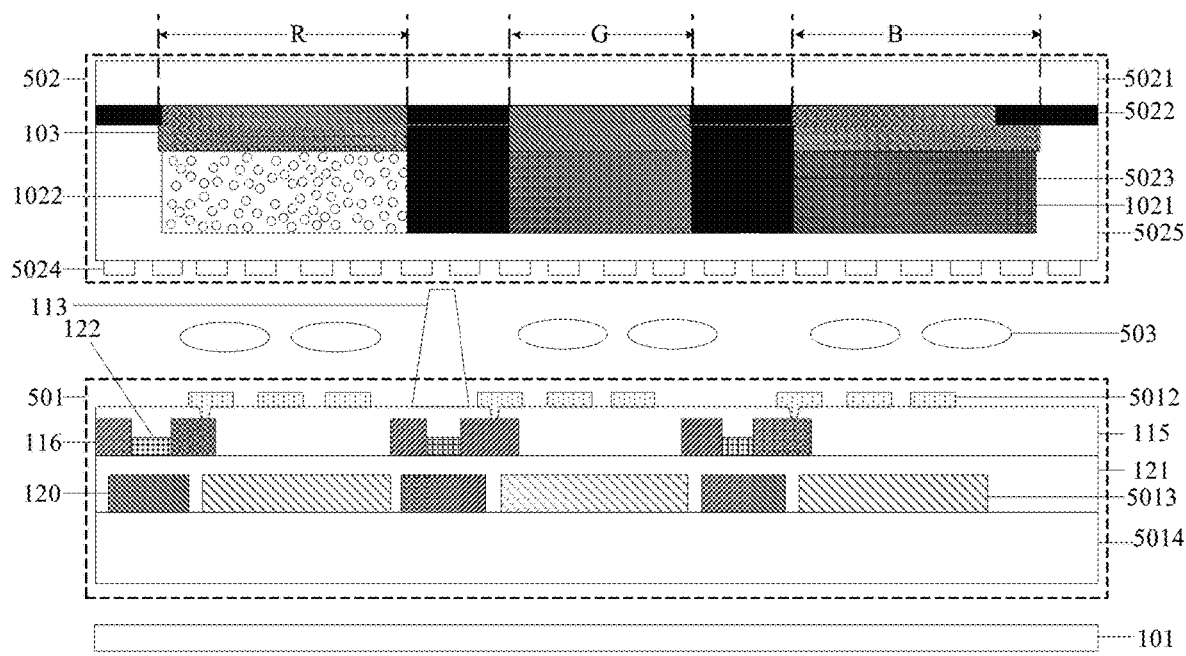
FIG. 5 is yet another schematic structural diagram of a display apparatus provided by an embodiment of the present disclosure.

In some embodiments, when the above display device is the LCD, as shown in FIG. 5, the light source 101 is a blue backlight source, and the display device further includes: an array substrate 501 and a second color filter substrate 502 disposed oppositely, and a liquid crystal layer 503 located between the array substrate 501 and the second color filter substrate 502.

The second color filter substrate 502 includes: a second base substrate 5021, a color resist layer 103 and a fifth black matrix 5022 sequentially located on the second base substrate 5021, and a light control layer 102 located on a side, facing away from the second base substrate 5021, of the color resist layer 103.

An orthographic projection of the fifth black matrix 5022 on the second base substrate 5021 partially overlaps an orthographic projection of the color resist layer 103, and in a direction perpendicular to the second base substrate 5021, the height of the fifth black matrix 5022 is smaller than the height of the color resist layer 103.

Since the color resist layer 103 is located in each sub-pixel region, by disposing the color resist layer 103 in opening regions of the fifth black matrix 5022, light emitted from a side surface of the color resist layer 103 of the different sub-pixel regions may be blocked from illuminating adjacent sub-pixel regions by using the fifth black matrix 5022. Thus, the fifth black matrix 5022 may avoid the light crosstalk of the red sub-pixel regions R, the green sub-pixel regions G, and the blue sub-pixel regions B, and improve the display effect.

In some embodiments, the LCD display apparatus, as shown in FIG. 5, may further include: a sixth black matrix 5023 located on a side, facing away from the second base substrate 5021, of the fifth black matrix 5022.

An orthographic projection of the sixth black matrix 5023 on the second base substrate 5021 partially overlaps an orthographic projection of the light control layer 102, and a surface of a side, facing away from the second base substrate 5021, of the sixth black matrix 5023 is flush with a surface of a side, facing away from the second base substrate 5021, of the light control layer 102.

In some embodiments, in the LCD display apparatus, as shown in FIG. 5, the second color filter substrate 502 further includes a metal transmission grating (WGP) 5024. Because the color conversion structures 1021 may depolarize polarized light passing through the liquid crystal layer 503, while the metal transmission grating 5024 has a polarization effect, the built-in metal transmission grating 5024 may be used to make light passing through the metal transmission grating 5024 form polarized light, so as to solve the depolarization problem of the color conversion structures 1021. The sixth black matrix 5023 may avoid the phenomenon of optical crosstalk on the one hand, and also has a flattening effect on the other hand, which is beneficial to the subsequent manufacturing of the metal transmission grating 5024. Further, in order to ensure the subsequent etching uniformity of the metal transmission grating 5024, the second color filter substrate 502 may further include a planar protective layer 5025. In some embodiments, the planar protective layer 5025 generally uses multilayer OC materials, such as a first light-curable OC material/a heat-curable OC material/a second light-curable OC material (UOC/HOC/FOC) and other high flatness materials.

The color conversion structures 1021 in the above LCD display apparatus provided by the present disclosure may be manufactured by using a high temperature process of 170° C. or 230° C. 170° C. is consistent with temperature of an existing QD product process, and 230° C. is consistent with temperature of an existing color filter substrate process. There is no need to re-adjust the temperature, which simplifies the manufacturing process.

In addition, in the LCD display apparatus provided by the present disclosure, as shown in FIG. 5, the array substrate 501 may further include a spacer layer 113, pixel electrodes 5012, a planar layer 115, sources and drains 116, an interlayer dielectric layer 117, gate electrodes 120, an active layer 122, common electrodes 5013 disposed on the same layer as the gates 120, and a third base substrate 5014.

It should be understood that in the present disclosure, "the same layer" refers to a layer structure formed by using the same film forming process to form a film layer configured to form a specific pattern, and then using the same mask to form the layer structure through a one-time patterning process. That is, the one-time patterning process corresponds to one mask (also referred to as a photomask). Depending on different specific patterns, the one-time patterning process may include repeated exposure, development or etching processes, the specific patterns in the formed layer structure may be continuous or discontinuous, and these specific patterns may also be at different heights or have different thicknesses.

Based on the same inventive concept, an embodiment of the present disclosure provides a manufacturing method of a display apparatus. Since the manufacturing method solves the problems in principles similar to those of the above display apparatus, implementation of the manufacturing method provided by embodiments of the present disclosure may refer to the implementation of the above display apparatus provided by embodiments of the present disclosure, which will not be repeated here.

In some embodiments, the manufacturing method of the display apparatus includes:
a light source is provided; and
a light control layer is formed on a light emitting side of the light source.

The display apparatus has a plurality of mutually independent sub-pixel regions. The light control layer includes: color conversion structures located in the sub-pixel regions. The color conversion structures include nanoporous materials and color conversion materials at least distributed in the nanoporous materials. The color conversion materials are used to convert light emitted from the light source into light of colors corresponding to the sub-pixel regions where the color conversion materials are located.

In some embodiments, in the above manufacturing method, forming the light control layer may be implemented in the following two possible manners.

First, the nanoporous materials and the color conversion materials are mixed, and the light control layer is formed by using the mixed materials. Second, a nanoporous material layer is formed, a photoresist layer including the color conversion materials is formed on the nanoporous material layer, and then the photoresist layer is patterned to obtain the light control layer.

It should be noted that in the above manufacturing method provided by embodiments of the present disclosure, the patterning process involved in forming each layer structure may not only include part or all of deposition, photoresist coating, masking with a mask, exposure, development, etching, photoresist stripping, etc., and may further include other processes, which specifically depends on patterns needing to be formed in the actual manufacturing process and is not limited here. For example, a post-baking process may also be included after development and before etching.

The deposition process may be a chemical vapor deposition method, a plasma enhanced chemical vapor deposition method or a physical vapor deposition method, which is not limited here. The mask used in the masking process may be a half tone mask, a single slit mask, or a gray tone mask, which is not limited here. The etching may be dry etching or wet etching, which is not limited here.

Manufacturing processes of the display apparatus shown in FIGS. 1 to 5 may be described in detail below.

In some embodiments, the manufacturing process of the display apparatus shown in FIG. 1 is as follows.

Step 1: first, a drive backplane 104 of a micro LED or mini LED is manufactured, including a substrate, and a buffer layer, a low-temperature polysilicon layer, a gate insulating layer, gates, an interlayer insulating layer, a source and drain layer, a planar layer and a pixel electrode layer sequentially formed on the substrate.

Step 2: blue micro LED or mini LED chips are transferred to the drive backplane 104 in a mass transfer manner for binding and upper electrode manufacturing. The blue micro LED or mini LED chips are the light source 101.

Step 3: the blue micro LED chips are protected, and for the blue mini LED chips, this process may be skipped.

Step 4: highly reflective retaining walls 106 are formed between the chips through a photolithography process. The film thickness of the retaining walls 106 is greater than the height of the chips, a slope angle is 85°-90° or more, and the surface reflectivity is greater than 70%-100%.

Step 5: color conversion structures 1021 of red sub-pixel regions R, color conversion structures 1021 of green sub-pixel regions G and light scattering structures 1022 of blue sub-pixel regions B are sequentially formed on the chips by a photolithography or printing process, preferably, by the photolithography process, and the printing process is prone to causing a high step difference, resulting in an uneven surface and affecting the light emitting efficiency. The color conversion structures 1021 are formed by mixing nanoporous materials, organic fluorescent dyes, scattering particles and photoresist. The light scattering structures 1022 are formed by mixing scattering particles and photoresist. Specifically, a photolithography process or a printing manner may be used for manufacturing. The color conversion structures 1021 and the light scattering structures 1022 constitute a light control layer 102.

Step 6: lens structures 105 are formed on the light control layer 102 by a photolithography process. In some embodiments, each lens structure 105 has a refractive index of 1.5-1.7, and an arch height h of 1 µm-2 µm.

Step 7: a black matrix, a first part, located in the red sub-pixel regions R, of the color resist layer 103, a second part, located in the green sub-pixel regions G, of the color resist layer 103, a third part, located in the blue sub-pixel regions B, of the color resist layer 103, and an OC insulating layer are sequentially manufactured on a first protective cover plate 107. In some embodiments, each layer is formed by a photolithography process.

In some embodiments, the manufacturing process of the display apparatus shown in FIG. 2 is as follows.

Step 1: first, a drive backplane is manufactured, including providing a bottom film substrate 125, and sequentially forming a buffer layer 124, a flexible substrate 123, an active layer 122 made of low-temperature polysilicon, a second gate insulating layer 121, gates 120 and second capacitor electrodes 118' disposed on the same layer, a first gate insulating layer 119, first capacitor electrodes 118, an interlayer dielectric layer 117, sources and drains 116, a flat layer 115, anodes 1011 and a pixel defining layer 114 on the bottom film substrate 125.

Step 2: a blue OLED device is formed on a layer where the anodes 1011 are located by evaporation, including a hole injection layer, a hole transport layer, an electron blocking layer, a blue light emitting layer 1012, a hole blocking layer, an electron transfer layer, an electron injection layer and cathodes 1013. The blue OLED device is a top-emission device. The cathodes 1013 adopt semi-permeable metal, such as Mg/Ag.

Step 3: the blue OLED device is encapsulated. A current mainstream encapsulation process for flexible OLEDs is an encapsulation layer 108 formed by a first inorganic encapsulation layer 1081, an organic encapsulation layer 1082 and a second inorganic encapsulation layer 1083. The first inorganic encapsulation layer 1081 and the second inorganic encapsulation layer 1083 are made of silicon nitride (SiN) or silicon oxide (SiO), and are manufactured by means of plasma chemical vapor deposition (PECVD). The organic encapsulation layer 1082 is made of an organic material, and is printed by inkjet printing (IJP).

Step 4: a low temperature color film on TFE (COE, TFE means Thin Film Encapsulation) manufacturing process is performed on the encapsulation layer 108, including: sequentially forming a black matrix, color conversion structures 1021 of red sub-pixel regions R, color conversion structures 1021 of green sub-pixel regions G, light scattering structures 1022 of blue sub-pixel regions B, a first part, located in the red sub-pixel regions R, of a color resist layer 103, a second part, located in the green sub-pixel regions G, of the color resist layer 103, a third part, located in the blue sub-pixel regions B, of the color resist layer 103, and an insulating layer 112. In order to ensure EL performance, the above layers need to use a low-temperature manufacturing process of 85° C. The color conversion structures 1021 are formed by mixing nanoporous materials, organic fluorescent dyes, scattering particles and photoresist. The light scattering structures 1022 are formed by mixing scattering particles and photoresist. In some embodiments, a photolithography process or a printing manner may be used for manufacturing. Or, a layer of porous metal structure with an aperture of 30 nm and a period of 110 nm is first formed in the red sub-pixel regions R and the green sub-pixel regions B by metal sputtering and etching, and then the color conversion structures 1021 are manufactured by using a mixture of the organic fluorescent dyes, the scattering particles and the photoresist. The color conversion structures 1021 and the light scattering structures 1022 constitute a light control layer 102. The black matrix may be a single-layer black matrix structure composed of a first black matrix 109, or a double-layer black matrix structure composed of the first black matrix 109 and a second black matrix 111. Specifically, when the black matrix is the double-layer black matrix structure, the first black matrix 109, the light control layer 102, the color resist layer 103 and the second black matrix 111 are sequentially manufactured before OC is manufactured. The second black matrix 111 may reduce the surface reflectivity of the display apparatus, but a line width of the second black matrix 111 may not cover the color resist layer 103 to avoid reducing the transmittance and aperture ratio. In addition, an area of the color resist layer 103 in each sub-pixel region must be larger than an area of the color conversion structures 1021 or the light scattering structures 1022 to avoid light leakage and color gamut reduction.

In some embodiments, the manufacturing process of the display apparatus shown in FIG. 3 is as follows.

Step 1: first, a display backplane 301 is manufactured, specifically including providing a bottom film substrate 125, and sequentially forming a buffer layer 124, a flexible substrate 123, an active layer 122 made of low-temperature polysilicon, a second gate insulating layer 121, gates 120 and second capacitor electrodes 118' disposed on the same layer, a first gate insulating layer 119, first capacitor electrodes 118, an interlayer dielectric layer 117, sources and drains 116, a flat layer 115, anodes 1011 and a pixel defining layer 114 on the bottom film substrate 125.

Step 2: a blue OLED device is formed on a layer where the anodes 1011 are located by evaporation, including a hole injection layer, a hole transport layer, an electron blocking layer, a blue light emitting layer 1012, a hole blocking layer, an electron transfer layer, an electron injection layer and cathodes 1013. The blue OLED device is a top-emission device. The cathodes 1013 adopt semi-permeable metal, such as Mg/Ag.

Step 3: the blue OLED device is encapsulated. A current mainstream encapsulation process for flexible OLEDs is an encapsulation layer 108 formed by a first inorganic encapsulation layer 1081, an organic encapsulation layer 1082 and a second inorganic encapsulation layer 1083. The first inorganic encapsulation layer 1081 and the second inorganic encapsulation layer 1083 are made of silicon nitride (SiN) or silicon oxide (SiO), and are manufactured by means of plasma chemical vapor deposition (PECVD). The organic encapsulation layer 1082 is made of an organic material, and is printed by inkjet printing (IJP).

Step 4: a first color filter substrate 302 is manufactured, specifically including: sequentially forming a black matrix, color conversion structures 1021 of red sub-pixel regions R, color of the green sub-pixel region G The conversion structure 1021, light scattering structures 1022 of blue sub-pixel regions B, a first part, located in the red sub-pixel regions R, of a color resist layer 103, a second part, located in the green sub-pixel regions G, of the color resist layer 103, a third part, located in the blue sub-pixel regions B, of the color resist layer 103, and an insulating protective layer 3024 on a first base substrate 3021. The above layers can be manufactured by using a high-temperature process of 170° C. or 230° C. to be consistent with an existing CF process. The color conversion structures 1021 are formed by mixing nanoporous materials, organic fluorescent dyes, scattering particles and photoresist. The light scattering structures 1022 are formed by mixing scattering particles and photoresist. In some embodiments, a photolithography process or a printing manner may be used for manufacturing. The color conversion structures 1021 and the light scattering structures 1022 constitute a light control layer 102. The black matrix may be a single-layer black matrix structure composed of a third black matrix 3022, or a double-layer black matrix structure composed of the third black matrix 3022 and a fourth black matrix 3023. Specifically, when the black matrix is the double-layer black matrix structure, the third black matrix 3022, the color resist layer 103, the fourth black matrix 3023, and the light control layer 102 are sequentially manufactured before OC is manufactured. The fourth black matrix 3023 may reduce the risk of pixel crosstalk. In addition, an area of the color resist layer 103 in each sub-pixel region must be larger than an area of the color conversion structures 1021 or the light scattering structures 1022 to avoid light leakage and color gamut reduction.

Step 5: the display substrate 301 and the first color filter substrate 302 are aligned and encapsulated, and a filler material (such as a sealant 303) or an air layer may be used therebetween for filling.

In some embodiments, the manufacturing process of the display apparatus shown in FIG. 4 is as follows.

Step 1: a drive backplane is manufactured, including providing a flexible substrate 123, and sequentially forming a light shielding layer 401, a buffer layer 124, an active layer 122, a second gate insulating layer 121, gates 120, an interlayer dielectric layer 117, sources and drains 116, a first part, located in red sub-pixel regions R, of a color resist layer 103, a second part, located in green sub-pixel regions G, of the color resist layer 103, a third part, located in blue sub-pixel regions B, of the color resist layer 103, color conversion structures 1021 of the red sub-pixel regions R, color conversion structures 1021 of the green sub-pixel regions G, light scattering structure 1022 of the blue sub-pixel regions B, a second resin layer 405, a second passivation layer 404, sub sources and drains 116', a first passivation layer 403, a first resin layer 402, anodes 1011, and a pixel defining layer 114. The color conversion structures 1021 are formed by mixing nanoporous materials, organic fluorescent dyes, scattering particles and photoresist. The light scattering structures 1022 are formed by mixing scattering particles and photoresist. In some embodiments, a photolithography process or a printing manner may be used for manufacturing. The color conversion structures 1021 and the light scattering structures 1022 constitute a light control layer 102. In addition, an area of the color resist layer 103 in each sub-pixel region must be larger than an area of the color conversion structures 1021 or the light scattering structures 1022 to avoid light leakage and color gamut reduction.

Step 2: the rest of components of a blue OLED device are formed on the anodes 1011 by evaporation, specifically including: a hole injection layer, a hole transport layer, an electron blocking layer, a blue light emitting layer, a hole blocking layer, an electron transfer layer, an electron injection layer and cathodes sequentially located above the anodes 1011. The blue OLED device is a top-emission device. The cathodes adopt total reflection metal, such as Ag.

Step 3: the blue OLED device is encapsulated. At present, rigid OLEDs generally adopt a cover encapsulation manner, and flexible OLEDs adopt a thin film encapsulation manner.

In some embodiments, the manufacturing process of the display apparatus shown in FIG. 5 is as follows.

Step 1: an array substrate 501 is manufactured, including providing a third base substrates 5014, and sequentially forming common electrodes 5013 and gates 120 disposed on the same layer, a second gate insulating layer 121, an active layer 122, sources and drains 116, a planar layer 115, pixel electrodes 5012, and a spacer layer 113 on the third base substrates 5014.

Step 2: a second color filter substrate 502 is manufactured, specifically including: providing a second base substrate 5021, and sequentially forming a black matrix, a first part, located in red sub-pixel regions R, of a color resist layer 103, a second part, located in green sub-pixel regions G, of the color resist layer 103, a third part, located in blue sub-pixel regions B, of the color resist layer 103, color conversion structures 1021 of the red sub-pixel regions R, color conversion structures 1021 of the green sub-pixel regions G, light scattering structure 1022 of the blue sub-pixel regions B, and a planar protective layer 5025 on the second base substrate 5021. The color conversion structures 1021 are formed by mixing nanoporous materials, organic fluorescent dyes, scattering particles and photoresist. The light scattering structures 1022 are formed by mixing scattering particles and photoresist. In some embodiments, a photolithography process or a printing manner may be used for manufacturing. The color conversion structures 1021 and the light scattering structures 1022 constitute a light control layer 102. In addition, an area of the color resist layer 103 in each sub-pixel region must be larger than an area of the color conversion structures 1021 or the light scattering structures 1022 to avoid light leakage and color gamut reduction. The black matrix may be a single-layer black matrix structure composed of a fifth black matrix 5022, or may be a double-layer black matrix structure composed of the fifth black matrix 5022 and a sixth black matrix 5023. In some embodiments, when the black matrix is the double-layer black matrix structure, before the planar protective layer 5025 is manufactured, the fifth black matrix 5022, the color resist layer 103, the sixth black matrix 5023, and the light control layer 102 are manufactured in sequence. The sixth black matrix 5023 facilitates subsequent manufacturing of a metal transmission grating 5024. In addition, in order to ensure subsequent etching uniformity of the metal transmission grating 5024, the planar protective layer 5025 generally uses multilayer OC materials, such as a first photo-curable OC material/a thermo-curing OC material/a second photo-curing OC material and other high flatness materials. The process temperature of each layer is 170° C. or 230° C.

Step 3: aluminum (Al) metal is deposited on the planar protective layer 5025, and the Al metal is etched to form the metal transmission grating 5024 with a width of 60 nm, a gap of 60 nm, and a height of 120 nm.

Step 4: the array substrate 501 and the second color filter substrate 502 are aligned by using a liquid crystal drop (ODF) manner, and a liquid crystal layer 503 is disposed therebetween for filling.

The above display apparatus provided by embodiments of the present disclosure includes: the plurality of mutually independent sub-pixel regions; the light source, where the light emitted by the light source illuminates each sub-pixel region; and the light control layer, located on the light emitting side of the light source. The light control layer includes: the color conversion structures located in the sub-pixel regions. The color conversion structures include the nanoporous materials and the color conversion materials at least distributed in the nanoporous materials. The color conversion materials are used to convert the light emitted by the light source into light of the colors corresponding to the sub-pixel regions where the color conversion materials are located. Since the size of the nanoporous materials is between 10 nm-100 nm, its microscopic size is small, and the specific surface area is large, light may have a strong scattering effect inside the nanopores, and the effective light path during the propagation process may be greatly enhanced. Therefore, when the color conversion materials are distributed in the porous material, the absorption rate of the color conversion materials to the light emitted by the light source may be increased, and the color conversion efficiency of the color conversion materials may be greatly improved. At the same time, the surface enhancement effect of most nanoporous materials may also enhance the fluorescence excitation characteristics and improve the luminous efficiency of the color conversion materials. Moreover, it may be understood that because the color conversion efficiency of the color conversion materials is greatly improved, the light control layer with the low film thickness may achieve high luminous efficiency, thereby reducing the film thickness of the fluorescent material and saving costs.

It will be apparent to those skilled in the art that various modifications and variations can be made in the embodiments of the present disclosure without departing from the spirit and scope of the embodiments of the present disclosure. Thus, it is intended that the present disclosure cover the modifications and variations of the embodiments of the present disclosure provided they come within the scope of the appended claims of the present disclosure and their equivalents.

What is claimed is:

1. A display apparatus, comprising:
   a plurality of mutually independent sub-pixel regions;
   a light source, wherein light emitted from the light source illuminates the sub-pixel regions; and
   a light control layer, located on a light emitting side of the light source, wherein the light control layer comprises: color conversion structures located in the sub-pixel regions, the color conversion structures comprise nanoporous materials and color conversion materials at least distributed in the nanoporous materials, and the color conversion materials are used to convert the light emitted from the light source into light of colors corresponding to the sub-pixel regions where the color conversion materials are located;
   wherein the sub-pixel regions comprise: blue sub-pixel regions, red sub-pixel regions and green sub-pixel regions;
   the color conversion structures are located in the red sub-pixel regions and the green sub-pixel regions, and the color conversion materials comprise: a red organic fluorescent dye located in the red sub-pixel regions, and a green organic fluorescent dye located in the green sub-pixel regions; and
   the light control layer further comprises: light scattering structures located in the blue sub-pixel regions;
   wherein the display apparatus further comprises: a color resist layer located on a side, facing away from the light source, of the light control layer and located in the sub-pixel regions, wherein an orthographic projection of the light control layer in each sub-pixel region is located within an orthographic projection of the color resist layer in each sub-pixel region;
   wherein the display apparatus further comprises: a drive backplane and lens structures, wherein
   the light source is located on the drive backplane, the light source comprises a plurality of blue diode chips, the color conversion structures and the light scattering structures cover the blue diode chips, and the lens structures are located between the light control layer and the color resist layer.

2. The display apparatus according to claim 1, wherein the color conversion materials are further located on a side, facing away from the light source, of a layer where the nanoporous materials are located.

3. The display apparatus according to claim 1, wherein a refractive index of each lens structure is 1.5-1.7, and a maximum distance between a surface, in contact with the color conversion structures, of each lens structure and a surface, in contact with the color resist layer, of each lens structure is 1 μm-2 μm.

4. The display apparatus according to claim 1, further comprising: retaining walls located between the adjacent color conversion structures and/or light scattering structures, wherein
   a slope angle of the retaining walls is 85°-90°, surface reflectivity of the retaining walls is 70%-100%, and a height of the retaining walls is greater than a height of the blue diode chips in a direction perpendicular to a plane where the drive backplane is located.

5. The display apparatus according to claim 1, wherein the light source comprises blue electroluminescent devices located in the sub-pixel regions, and the display apparatus further comprises: an encapsulation layer located between a layer where the blue electroluminescent devices are located and the light control layer, and a first black matrix located between the encapsulation layer and the light control layer; and
   an orthographic projection of the first black matrix on a plane where the display apparatus is located partially overlaps an orthographic projection of the light control layer, and a height of the first black matrix is smaller than a height of the light control layer in a direction perpendicular to the plane where the display apparatus is located.

6. The display apparatus according to claim 5, further comprising: a second black matrix located on a side, facing away from the encapsulation layer, of the first black matrix, wherein
   an orthographic projection of the second black matrix on the plane where the display apparatus is located and an orthographic projection of the color resist layer do not overlap each other, and a height of the second black matrix is smaller than a height of the color resist layer in the direction perpendicular to the plane where the display apparatus is located.

7. The display apparatus according to claim 1, wherein the light source comprises blue electroluminescent devices located in the sub-pixel regions, and the display apparatus further comprises: a display substrate and a first color filter substrate disposed oppositely;
   the display substrate comprises: the blue electroluminescent devices;
   the first color filter substrate comprises: a first base substrate, a color resist layer and a third black matrix which are located on the first base substrate, and a light control layer located on a side, facing away from the first base substrate, of the color resist layer; and
   a boundary of an orthographic projection of the third black matrix on the first base substrate and a boundary of an orthographic projection of the color resist layer overlap each other, and a height of the third black matrix is the same as a height of the color resist layer in a direction perpendicular to the first base substrate.

8. The display apparatus according to claim 7, further comprising: a fourth black matrix, located on a side, facing away from the first base substrate, of the third black matrix, wherein
   a boundary of an orthographic projection of the fourth black matrix on the first base substrate and a boundary of an orthographic projection of the light control layer overlap each other, and a height of the fourth black matrix is the same as a height of the light control layer in the direction perpendicular to the first base substrate.

9. The display apparatus according to claim 1, wherein the light source is a blue backlight source, and the display apparatus further comprises: an array substrate and a second color filter substrate disposed oppositely, and a liquid crystal layer located between the array substrate and the second color filter substrate;
  the second color filter substrate comprises: a second base substrate, a color resist layer and a fifth black matrix sequentially located on the second base substrate, and a light control layer located on a side, facing away from the second base substrate, of the color resist layer; and
  an orthographic projection of the fifth black matrix on the second base substrate partially overlaps an orthographic projection of the color resist layer, and a height of the fifth black matrix is smaller than a height of the color resist layer in a direction perpendicular to the second base substrate.

10. The display apparatus according to claim 9, further comprising: a sixth black matrix located on a side, facing away from the second base substrate, of the fifth black matrix, wherein
  an orthographic projection of the sixth black matrix on the second base substrate partially overlaps an orthographic projection of the light control layer, and a surface of a side, facing away from the second base substrate, of the sixth black matrix is flush with a surface of a side, facing away from the second base substrate, of the light control layer.

11. The display apparatus according to claim 1, wherein the light source comprises blue electroluminescent devices located in the sub-pixel regions, the display apparatus further comprises: a light shielding layer located on a side, facing away from a layer where the blue electroluminescent devices are located, of the color resist layer, and an orthographic projection of the light shielding layer on a plane where the display apparatus is located does not overlap an orthographic projection of the color resist layer.

12. A manufacturing method of the display apparatus of claim 1, comprising:
  providing a light source; and
  forming a light control layer on a light emitting side of the light source, wherein
  the display apparatus has a plurality of mutually independent sub-pixel regions, the light control layer comprises: color conversion structures located in the sub-pixel regions, the color conversion structures comprise nanoporous materials and color conversion materials at least distributed in the nanoporous materials, and the color conversion materials are used to convert light emitted from the light source into light of colors corresponding to the sub-pixel regions where the color conversion materials are located.

13. The manufacturing method according to claim 12, wherein the forming the light control layer comprises:
  mixing the nanoporous materials and the color conversion materials, and forming the light control layer by using mixed materials; or, forming a nanoporous material layer, forming a photoresist layer comprising the color conversion materials on the nanoporous material layer, and obtaining the light control layer by patterning the photoresist layer.

* * * * *